US009984860B1

(12) United States Patent
Walton et al.

(10) Patent No.: US 9,984,860 B1
(45) Date of Patent: May 29, 2018

(54) APPARATUS AND METHOD FOR AUGMENTING THE VOLUME OF ATMOSPHERIC PRESSURE PLASMA JETS

(71) Applicant: The United States of America, as represented by the Secretary of the Navy, Washington, DC (US)

(72) Inventors: Scott G. Walton, Fairfax, VA (US); David R. Boris, Silver Spring, MD (US); Tzvetelina Petrova, Gaithersburg, MD (US); Eric D. Gillman, Arlington, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/795,714

(22) Filed: Oct. 27, 2017

Related U.S. Application Data

(60) Provisional application No. 62/417,372, filed on Nov. 4, 2016.

(51) Int. Cl.
*H05H 1/42* (2006.01)
*H01J 37/32* (2006.01)

(52) U.S. Cl.
CPC ... *H01J 37/32449* (2013.01); *H01J 2237/327* (2013.01)

(58) Field of Classification Search
CPC .. H05H 1/26; H05H 1/30; H05H 1/34; H05H 1/3405; H05H 1/42; H05H 1/46; H05H 2001/4607; H05H 2001/4645; H05H 2001/466; H05H 2240/10; H05H 2240/20; H01L 21/32136; H01L 28/60; (Continued)

(56) References Cited

U.S. PATENT DOCUMENTS 8,920,610 B2 * 12/2014 Buske .................. G01N 27/70
204/164
8,920,740 B2 * 12/2014 Yang ....................... H05H 1/30
422/162

(Continued)

FOREIGN PATENT DOCUMENTS

KR 20090112831 A 10/2009
WO 2010013293 A1 4/2010

OTHER PUBLICATIONS

Korea Patent Office Search Report and Written Opinion dated Feb. 20, 2018 in corresponding PCT Application No. PCT/US17/58712.

(Continued)

*Primary Examiner* — Haissa Philogene
(74) *Attorney, Agent, or Firm* — US Naval Research Laboratory; Joslyn Barritt

(57) ABSTRACT

An apparatus and methods to increase and direct the spatial volume of atmospheric pressure plasma jets. One or more additional gas flows is introduced to intersect the plasma jet. As the plasma jet interacts with these additional gas flows, the direction of propagation of the plasma jet is altered, the plasma expands into the volume defined by the additional gas flow, and the volume and effective surface area of the plasma jet increases accordingly, while the power increase needed to drive the increase in plasma volume scales sublinearly with the increase in volume.

19 Claims, 9 Drawing Sheets

(58) Field of Classification Search
CPC .............................. B01J 12/002; B01J 19/088; B01J 2219/0809; B01J 2219/0875; C01B 2203/0861
See application file for complete search history.

(56) References Cited

U.S. PATENT DOCUMENTS

| | | | |
|---|---|---|---|
| 2009/0122941 A1* | 5/2009 | Engemann | ............ H01L 41/107 376/145 |
| 2010/0015350 A1 | 1/2010 | Allen | |
| 2012/0067716 A1 | 3/2012 | Buske | |
| 2013/0052092 A1 | 2/2013 | Yang et al. | |

OTHER PUBLICATIONS

D. B. Graves, "Low temperature plasma biomedicine: A tutorial review," Phys. of Plasmas 21, 080901 (2014).
M. G. Kong, et al., "Plasma medicine: an introductory review," New J. Phys. 11, 115012 (2009).
X. Lu, et al., "Reactive species in non-equilibrium atmospheric-pressure plasmas: Generation, transport, and biological effects," Physics Reports 630, 1-84 (2016).
D. Pappas, "Status and potential of atmospheric plasma processing of materials," J. Vac. Sci. Technol. A 29, 020801 (2011).
C. L. Enloe, et al., "Surface Potential and Longitudinal Electric Field Measurements in the Aerodynamic Plasma Actuator," AIAA Journal 46, 2730 (2008).
G. M. Petrov, et al., "Investigation of industrial-scale carbon dioxide reduction using pulsed electron beams," J. Appl. Phys. 119, 103303 (2016).
X. Lu, et al., "Guided ionization waves: Theory and experiments," Physics Reports 540 123-166 (2016).
M. Ghasemi, et al., "Interaction of multiple plasma plumes in an atmospheric pressure plasma jet array," Journal of Physics D: Applied Physics 46, 052001 (2013).
Q.Y. Nie, et al., "A two-dimensional cold atmospheric plasma jet array for uniform treatment of large-area surfaces for plasma medicine," New J. Phys. 11 115015 (2009).
C. Douat, et al., "Interactions Between Two Counter Propagating Plasma Bullets," IEEE Trans Plasma Sci. 39, 2298-2299 (2011).
C. Douat, G. et al., "Dynamics of colliding microplasma jets," Plasma Sources Sci. Technol. 21, 034010-8 (2012).

* cited by examiner

APPARATUS AND METHOD FOR AUGMENTING THE VOLUME OF ATMOSPHERIC PRESSURE PLASMA JETS

CROSS-REFERENCE

This Application is a Nonprovisional of and claims the benefit of priority under 35 U.S.C. § 119 based on U.S. Provisional Patent Application No. 62/417,372 filed on Nov. 4, 2016. The Provisional Application and all references cited herein are hereby incorporated by reference into the present disclosure in their entirety.

TECHNICAL FIELD

The present disclosure relates to atmospheric pressure plasma jets, and in particular to apparatuses that can be used to increase and control the volume of such plasma jets.

BACKGROUND

Over the past two decades, there has been a surge of interest in atmospheric pressure plasmas. These include glow discharges, high frequency and dielectric barrier discharges, microwave sustained plasmas, plasma jets and torches, microplasmas, laser-induced plasmas, electron beam generated plasmas, and many others. Typically, their design and operation are tailored for specific applications or to enable different technologies in areas as varied as biology and medicine (see D. B. Graves, "Low temperature plasma biomedicine: A tutorial review," *Phys. of Plasmas* 21, 080901 (2014); M. G. Kong, et al., "Plasma medicine: an introductory review," *New J. Phys.* 11, 115012 (2009); and X. Lua, et al., "Reactive species in non-equilibrium atmospheric-pressure plasmas: Generation, transport, and biological effects," *Physics Reports* 630, 1-84 (2016)); chemistry and material science (see D. Pappas, "Status and potential of atmospheric plasma processing of materials," *J. Vac. Sci. Technol. A* 29, 020801 (2011)); aerospace science (see C. L. Enloe, et al., "Surface Potential and Longitudinal Electric Field Measurements in the Aerodynamic Plasma Actuator," *AIAA Journal* 46, 2730 (2008)); and environmental engineering (see G. M. Petrov, et al., "Investigation of industrial-scale carbon dioxide reduction using pulsed electron beams," *J. Appl. Phys.* 119, 103303 (2016)).

Atmospheric pressure plasmas have certain advantages in materials synthesis and processing that are not available with other approaches including low-pressure plasmas. The breadth of reactions afforded by non-equilibrium, low-temperature plasmas makes them particularly advantageous, and when produced in full density air, such plasmas can be used with systems and materials that are not vacuum-compatible.

One type of non-equilibrium, atmospheric pressure plasmas, often referred to as "plasma jets," are well-suited for such applications given their relatively simple design, flexible electrode geometry, and modest power requirements. Plasma jets are created when a discharge generated in a confined gas flow, usually a pure or diluted noble gas flowing through a dielectric tube, leaves the region of confinement and propagates through the surrounding ambient. See X. Lu, et al., "Guided ionization waves: Theory and experiments," *Physics Reports* 540 123-166 (2016).

FIGS. 1A and 1B illustrate an exemplary conventional apparatus developed at the U.S. Naval Research Laboratory for generating a plasma jet. As shown in the block schematic of FIG. 1A and the photographic image in FIG. 1B, a plasma jet can be generated from a flow 101 of a noble gas such as helium (He), neon (Ne), argon (Ar), krypton (Kr), or xenon (Xe), which passes into a cylinder 102 within an outer casing 106, in which is situated an electrode 103 connected to a voltage source 104. As the gas 101 passes over the electrode 103, it is ionized and forms the plasma jet 105 that is output from the cylinder 102.

Plasma jets can be made quite small, which is good for high-precision applications. See Lua, supra. However, it is difficult to produce jet systems that can scale to treat large surface areas, and as a result, the maximum treatment areas are generally limited to about 1 cm$^2$. See M. Ghasemi, et al., "Interaction of multiple plasma plumes in an atmospheric pressure plasma jet array," *Journal of Physics D: Applied Physics* 46, 052001 (2013).

To address the desire for plasma treatment in larger areas, several researchers have constructed one- and two-dimensional arrays of plasma jets, where the treatment area scales with the number of jets. See Ghasemi, supra; see also Q. Y. Nie, et al., "A two-dimensional cold atmospheric plasma jet array for uniform treatment of large-area surfaces for plasma medicine," *New J. Phys.* 11 115015 (2009). However, this approach requires increases in power and gas flow, and these increases in power and gas flow also scale with the number of jets. For example, two jets operating in parallel will require twice the gas flow and power input.

It has also been shown that combining two counter-propagating plasma jets effectively extends the length of a plasma discharge. See C. Douat, et al., "Interactions Between Two Counter Propagating Plasma Bullets," *IEEE Trans Plasma Sci.* 39, 2298-2299 (2011); see also C. Douat, G. et al., "Dynamics of colliding microplasma jets," *Plasma Sources Sci. Technol.* 21, 034010-8 (2012). The two plasma jets can be produced using either two opposing gas flows, each with a corresponding power source and electrode or a single gas stream flowing between two electrodes. In either case, the power requirements effectively double.

Although these approaches clearly work in the sense that the volume and/or effective treatment area increases, the power needed to produce the plasma volume increases as the plasma volume increases. In addition, device complexity increases since both the driving circuit and gas delivery system must be carefully designed so that all of the plasma jets are driven simultaneously and with equal intensity.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an apparatus and methods to increase the spatial volume of atmospheric pressure plasma jets without the use of additional power supplies, circuits or electrodes. Instead, only one or more additional neutral gas streams that are not aligned with the plasma jet axis and intersect the plasma jet at an arbitrary angle are used. As the plasma jet interacts with these additional gas flows, the direction of propagation of the plasma jet is altered, the plasma expands into the volume defined by the additional gas flow, and the effective volume and thus surface area of the plasma jet increases accordingly, while the power increase needed to drive the increase in plasma volume scales sub-linearly with the increase in volume.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

This disclosure describes a means to increase the volume of atmospheric pressure plasma jets without the use of additional power supplies, driving circuitry, or physical confinement. Instead, the plasma volume is increased and its spatial profile can be tailored by controlling the background gas density through the injection of one or more neutral gas streams. Increasing the plasma volume through this approach provides more useful charged and reactive neutral gas species and increases the effective surface treatment area.

Thus, the present invention provides an apparatus and methods to increase the volume of atmospheric pressure plasma jets and tailor their spatial distribution without the use of additional power supplies, circuits or electrodes. Instead, we use only one or more additional gas flows that intersect the plasma jet.

As the plasma jet interacts with these additional gas flows, the direction of propagation of the plasma jet is altered, the plasma expands into the volume defined by the additional gas flow, and the effective surface area of the plasma jet increases accordingly, while the power increase needed to drive the increase in plasma volume scales sub-linearly with the increase in volume. In many embodiments, these additional gas flows will flow in a plane orthogonal to the plasma jet axis, but such orthogonality is not required, and gas flows in any direction not aligned with the plasma jet axis, intersecting the plasma jet at an arbitrary angle, can also be used.

The simplest embodiment of this invention includes a plasma jet and a neutral gas stream, propagating at right angles to one another. This configuration and an extension of it, two neutral gas streams propagating in opposite directions (but still orthogonal to the plasma jet axis), are shown in FIGS. 2A-2D.

Figure 1A:
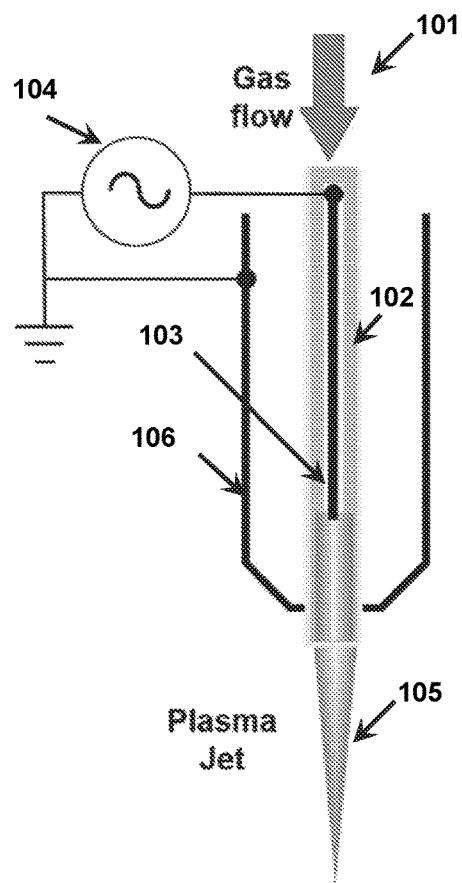
FIGS. 1A and 1B depict aspects of plasma jet generation in accordance with the prior art.
Figure 1B:
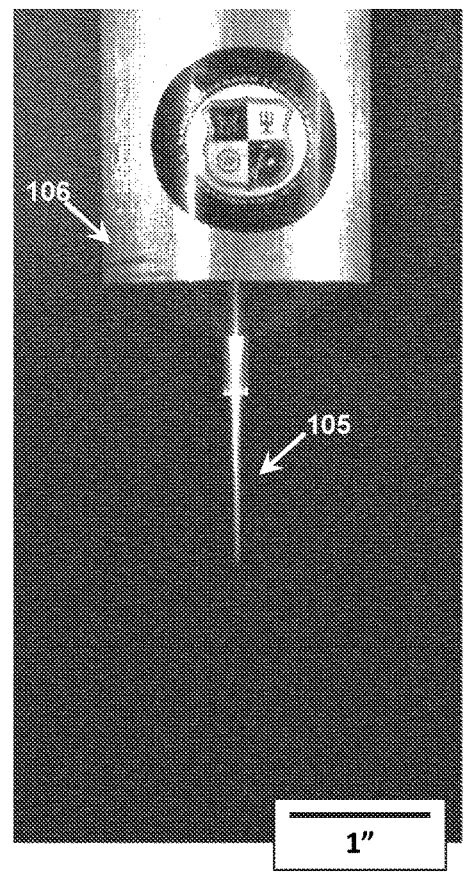
Figure 2A:
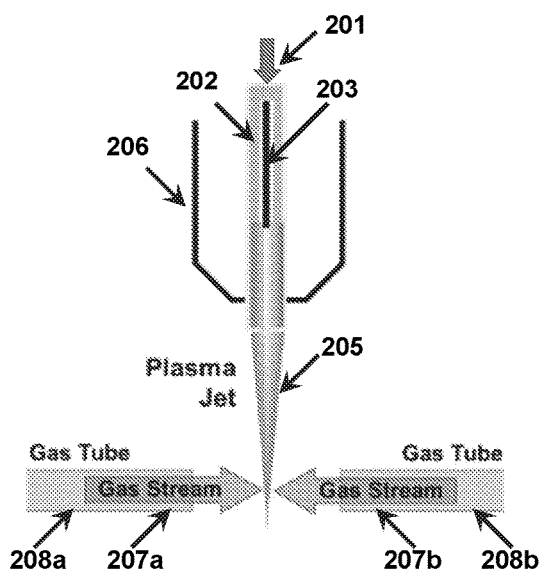
FIGS. 2A-2D depict aspects of an apparatus and method for production of a spatially modified plasma jet volume in accordance with the present invention.

FIG. 2A is a block schematic illustrating aspects of the generation of a plasma jet in accordance with the present invention. As shown by the block schematic in FIG. 2A and the photographic image in FIG. 2B, a plasma jet 205 can be generated from a flow of helium gas 201 travelling in a cylinder 202 within an outer casing 206, past an electrode 203 connected to an AC (f=25-35 kHz), high voltage (Vpp=500-2000 V) signal (not shown). In accordance with the present invention, one or more neutral gas streams 207a/207b are directed through tubes 208a/208b so as to propagate in directions not aligned with the axis of the plasma jet 205. In most embodiments described, neutral gas streams 206a/206b will be helium, though other neutral gases may be used as appropriate.

As described in more detail below, in accordance with the present invention, the neutral gas stream(s) interact with the plasma jet and produce a volumetric distribution of the plasma from the plasma jet that is not aligned with the plasma jet's original direction of propagation. By tuning any one or more of the parameters of the gas stream, such as the shape and spatial distribution of the neutral gas streams, flow direction, and the gas used, a desired spatial distribution of the plasma volume can be achieved.

Figure 2B:
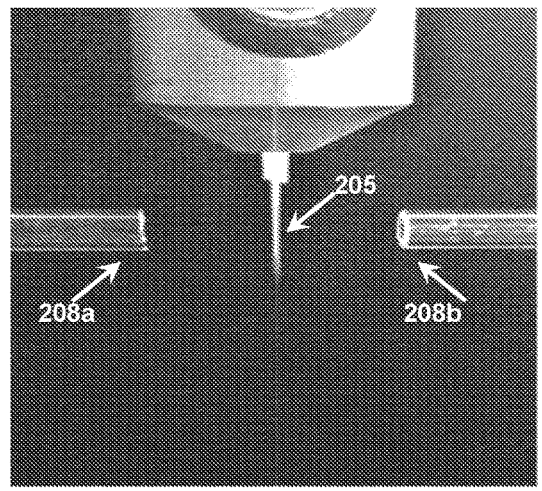
Figure 2C:
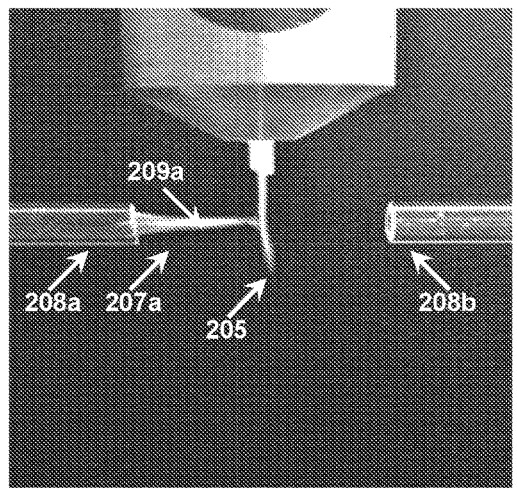

The photographic images in FIGS. 2B-2C illustrate how the presence of a neutral gas stream orthogonal to a plasma jet can produce a spatially altered distribution of plasma volume in accordance with the present invention.

Thus, FIG. 2B shows the case with no gas exiting from either of gas tubes 208a/208b, and shows plasma jet 205 exiting from the chamber in a substantially straight stream in the direction of the original helium gas flow through the chamber.

Figure 2D:
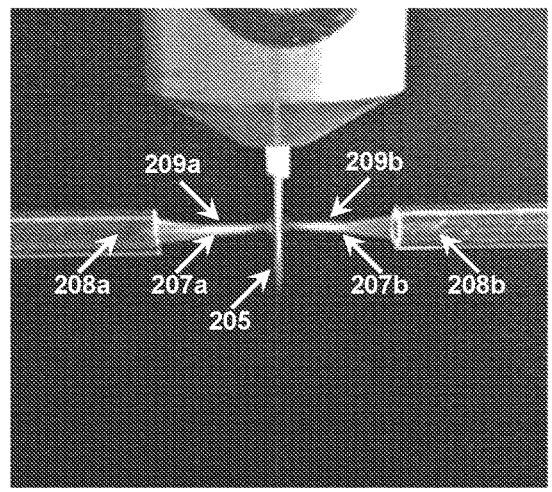

FIGS. 2C and 2D illustrate what happens when one or more orthogonal gas streams are directed into the plasma jet.

As can be seen in FIG. 2C, with the presence of a gas stream 206a exiting from gas tube 208a, part of the plasma volume from plasma jet 205 interacts with the neutral gas, producing an additional plasma volume 209a that extends into the gas stream. As shown in the photographic image in FIG. 2D, when the neutral gas stream 207a/207b propagates from both gas tubes 208a/208b, additional plasma volumes 209a/209b are created.

As can be seen from both FIG. 2C and FIG. 2D, the additional plasma volumes 209a/209b propagates in the direction of the neutral gas density rather than in the direction of flow. The total plasma volume is increased by the introduction of the neutral gas streams into the plasma jet in accordance with the present invention, with the increase in plasma volume typically being on the order of a two-fold increase if one gas stream is present, and three-fold if two gas streams are used.

Figure 3:
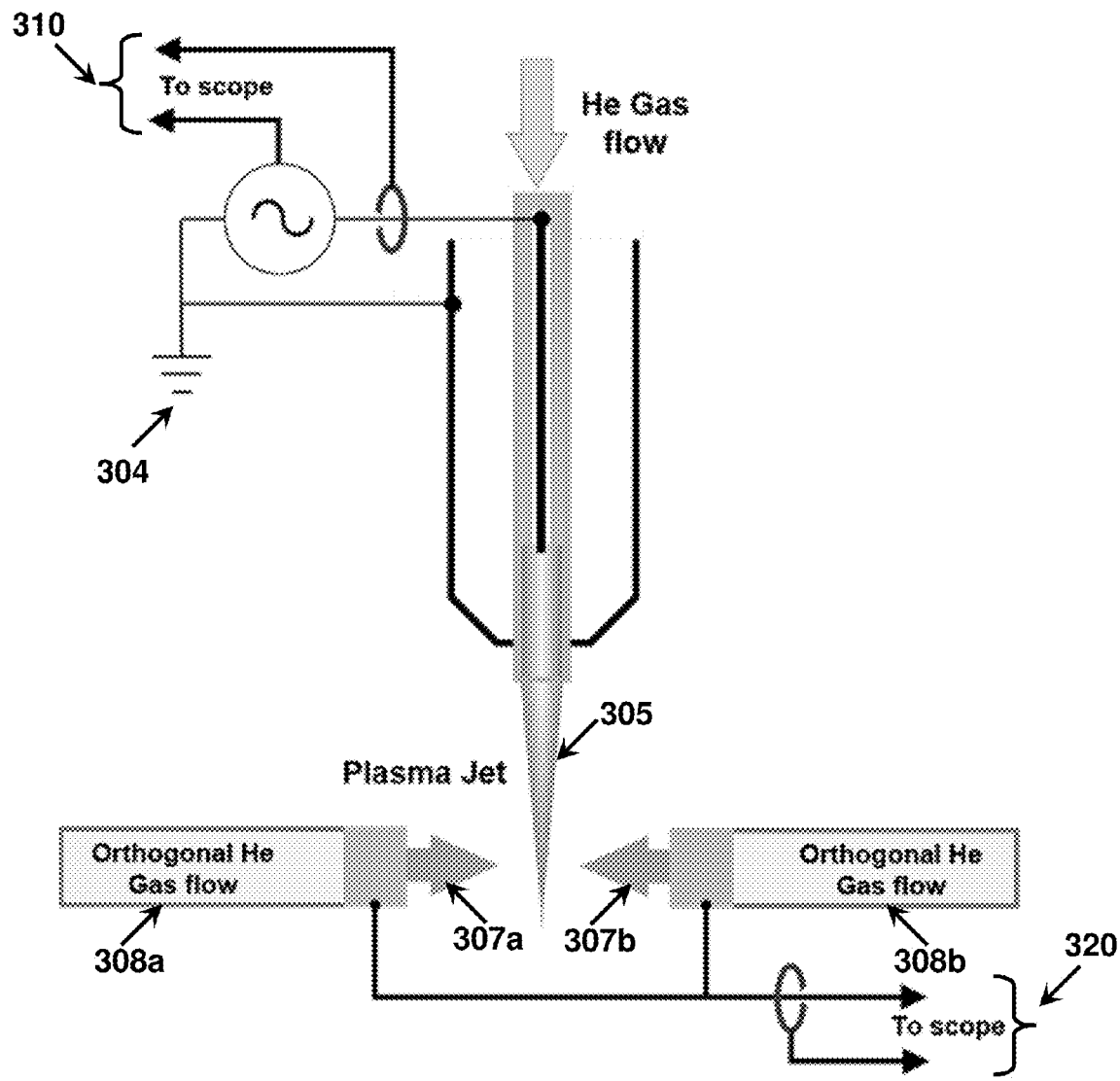
FIG. 3 is a block diagram illustrating aspects of an apparatus for measuring voltage and current in an apparatus for generation of a spatially modified plasma jet volume in accordance with the present invention.

To better understand this system, current-voltage measurements were performed using the configuration shown in FIG. 3, where the voltage and current from the power supply driving the plasma could be monitored along with the current collected on grounded collar 320 at the exit of the opposing gas tubes.

Figure 4A:
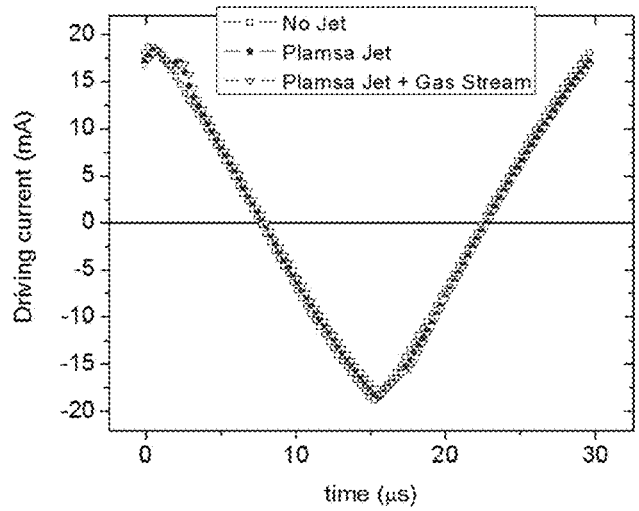
FIGS. 4A-4C are plots illustrating voltage and current measured by an apparatus such as that illustrated in FIG. 3 in "no jet," "plasma jet," and "plasma jet+gas stream" cases.
Figure 4B:
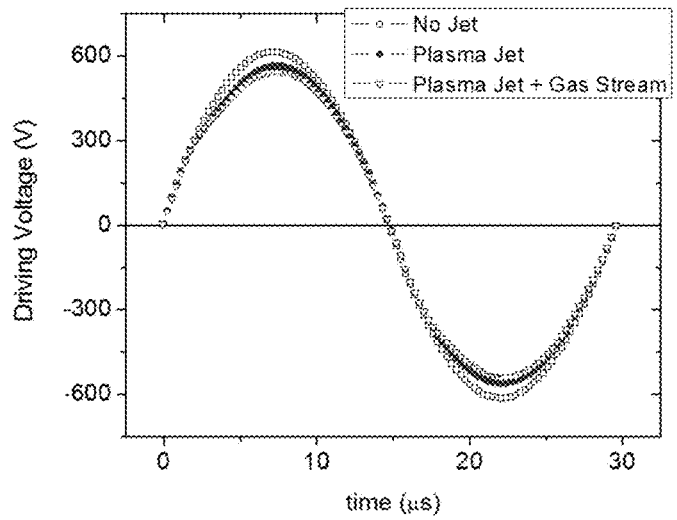
Figure 4C:
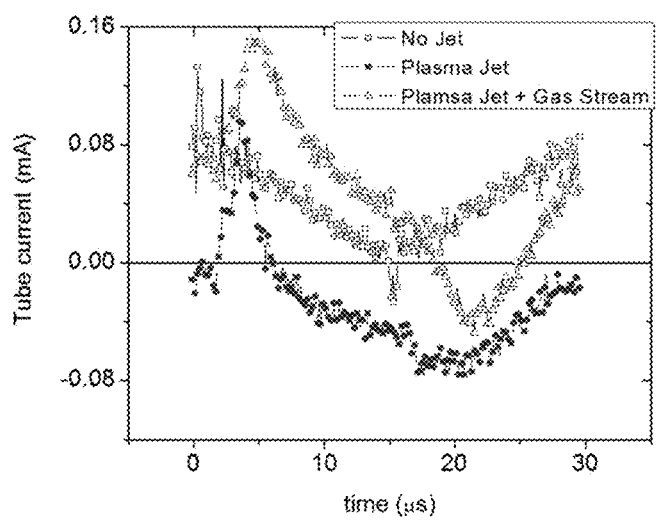
Figure 5A:
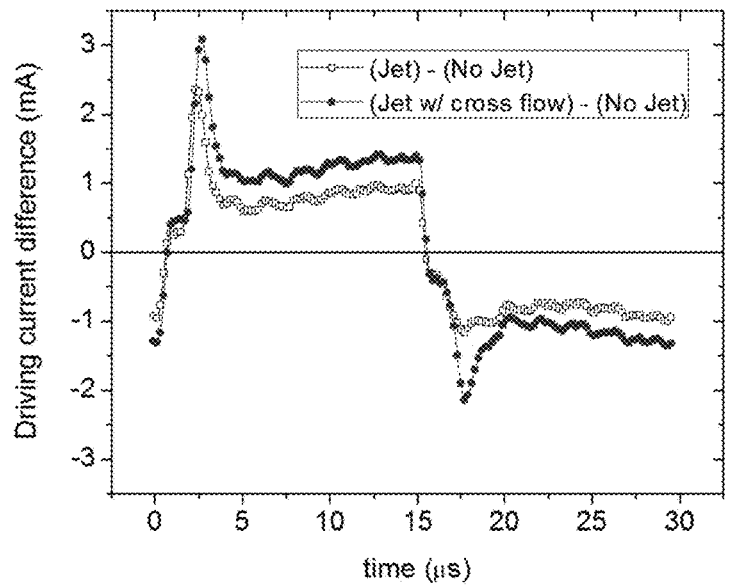
FIGS. 5A and 5B are additional plots illustrating driving current and driving power associated with the production of a plasma jet volume with and without one or more orthogonal neutral gas streams in accordance with the present invention.
Figure 5B:
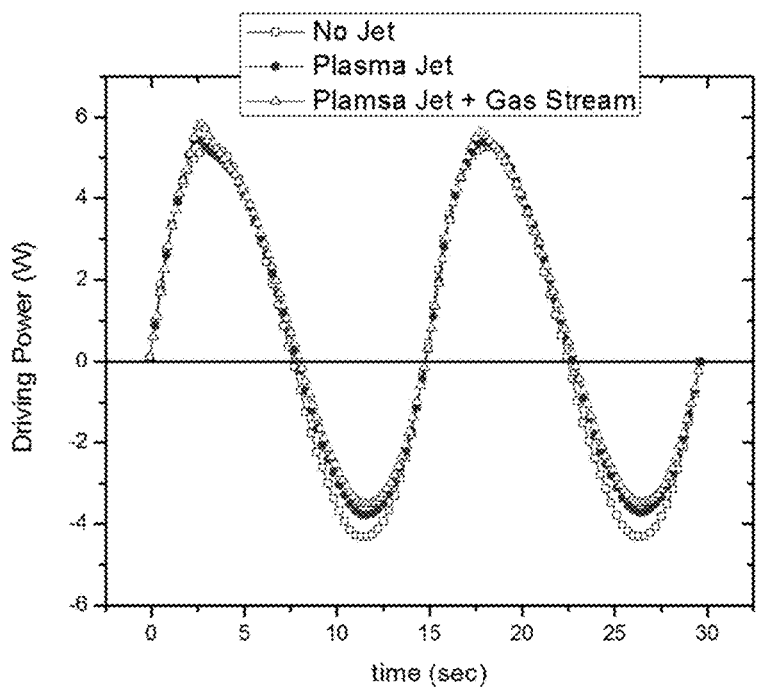

As described in more detail below, the results of these voltage and current measurements for three operational schemes, "no jet," "plasma jet," and "plasma jet+gas stream," are shown by the plots in FIGS. 4A-4C, where FIG. 4A shows the driving voltage (in kV) for the three operational schemes, FIG. 4B shows the driving current (in mA), FIG. 4C shows the current (in mA) measured at the exit of the gas stream tube. Additional aspects of the three operations schemes are shown by the plots in FIGS. 5A and 5B, where FIG. 5A shows the difference in driving current (in mA) between the "plasma jet" vs. "no jet" case and the "plasma jet+gas stream" and "no jet" case and FIG. 5B shows the difference in driving power (in W) between the "no jet," "plasma jet," and "plasma jet+gas stream" schemes.

For the "no jet" case, shown by the hollow square dotted line in the FIGURES, power is applied to the electrode but no gas flows past the electrode; without such flow a plasma jet cannot be produced. The "plasma jet" case, shown by the solid round dotted line in the FIGURES reflects typical operation for the production of a plasma jet, where gas flows past a powered electrode to produce a plasma jet that emerges from the tube as a freely propagating plasma. For both the "no jet" and "plasma jet" operational modes, no additional gas streams are intersecting with the plasma jet. For the "plasma jet+gas stream" case, shown by the hollow triangle dotted line in the FIGURES, gas streams emerge from the gas tubes causing the discharge to propagate toward both gas tubes, as discussed above with respect to FIG. 2D.

The I-V measurements in the absence of plasma (no jet) represent the baseline values for the driving circuit, where the displacement currents at the driven electrode and gas tube collars are due to the oscillating high voltage signal. In the presence of flowing helium, small deviations from these baselines signals represent the contributions due to the plasma resistivity. In particular, the current spikes at ≈2-3 μs and 17-18 μs on the electrode current shown in FIG. 4B represent the ignition of streamer-like discharges that form the plasma jets. Similar current spikes are also measured at the ground collars after a small time delay, commensurate with the discharge propagation time. Note, that while current on the collars is measured without the orthogonal gas streams, no emission (light) is observed in the volume between the jets axis and the gas tubes, suggesting a very weak, if not negligible plasma current. The presence of helium is critical to the production of plasma ("no jet" vs. "plasma jet" operating modes) and so, the increase in current measured on the collars with the helium gas streams flowing is not surprising.

An increase in volume is expected to require an increase in applied power. The discharge current along with instantaneous power measured at the driven electrode is shown in FIGS. 5A and 5B, respectively. The difference between the instantaneous power curves for the cases with and without plasma jet is the power required to drive the discharge. This power is found to increase when the gas streams are introduced, with this increase being largely due to an increase in discharge current, as seen in FIG. 5A. The average power per period is found to increase by approximately 50% when the gas streams are turned on. From earlier then, we see that a 3-fold increase in plasma volume comes at a relatively modest 50% increase in power.

FIGS. 6A-6B, 7A-7C and 8A-8B, and 9A-9C illustrate additional exemplary embodiments of the use of neutral gas streams to increase and tailor a plasma jet volume in accordance with the present invention. The embodiments described herein fall into two broad categories, the use of different gases and different gas flow geometries. In addition, although not described in detail herein, one skilled in the art would readily understand that tailoring other parameters of the neutral gas flow, such as its speed, volume, or composition, can also be used in accordance with the present invention to obtain a desired plasma jet volume.

Figure 6A:
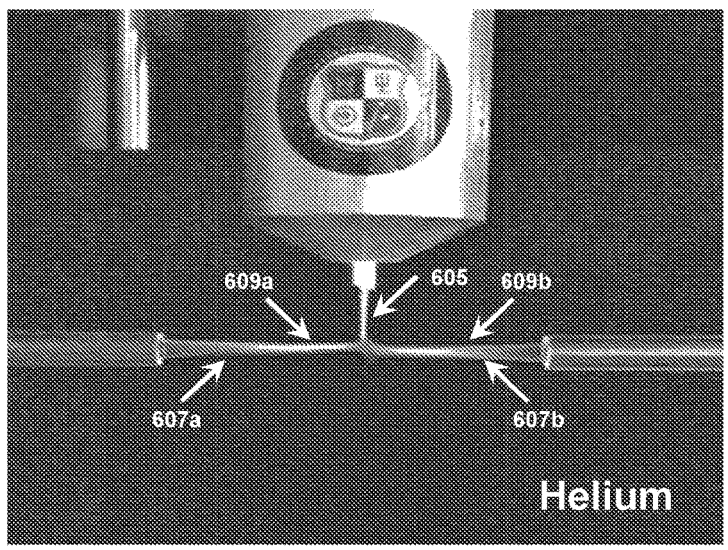
FIGS. 6A and 6B are photographic images illustrating production of extended plasma jet volumes in accordance with the present invention using helium (FIG. 6A) and neon (FIG. 6B) gas streams.
Figure 6B:
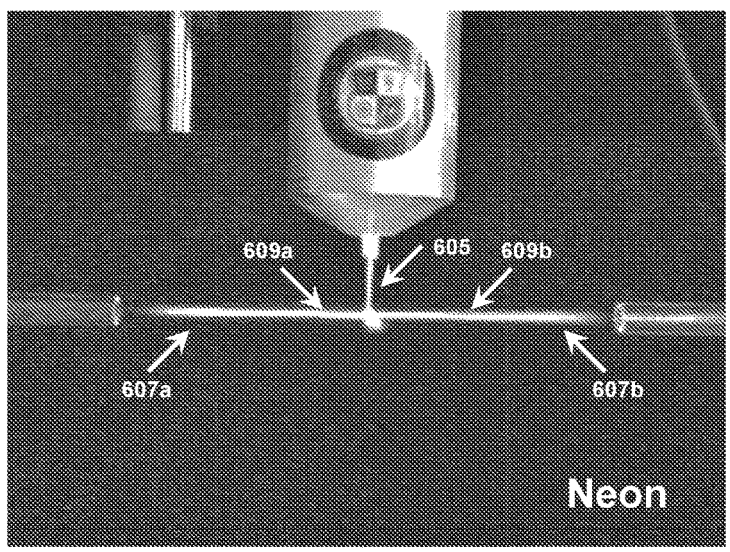

FIGS. 6A and 6B show the effect of the use of different gases on the plasma jet volume in accordance with the present invention. FIG. 6A shows a plasma jet 605 produced in a helium background interacting with opposing helium gas streams 607a/607b to produce additional plasma volumes 609a/609b extending into the direction of the helium gas density, while FIG. 6B shows the plasma jet 605 produced in a helium background interacting with neon gas streams 607a/607b that originate farther from the plasma jet than do the helium gas streams. As can be seen from these FIGURES, the use of neon gas streams produces an additional plasma volume that extends farther from the plasma jet than when compared to the helium gas stream. Other gases may also be used to obtain a desired spatial distribution of the plasma volume.

Plasmas are often used to treat large surfaces. Since a plasma jet is only able to treat a very small area, roughly that determined by the radius of the plasma jet, in current practice, large area treatments require that one or more plasma jets must be scanned over the entire surface. As described below, the concepts and embodiments discussed above can be further utilized to increase the treatment area of a plasma jet.

Figure 7A:
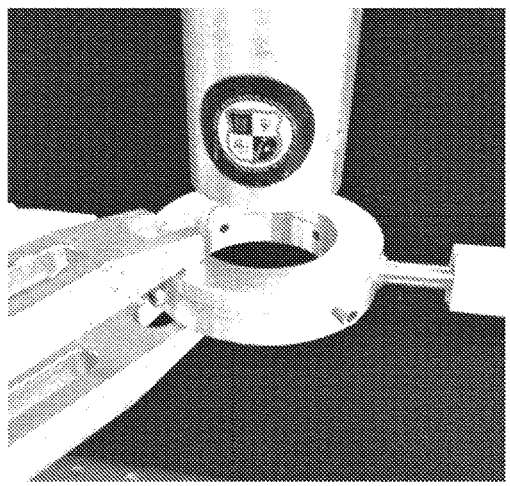
FIGS. 7A-7C are photographic images illustrating aspects of an extended plasma jet volume produced in accordance with the present invention using four neutral gas streams, flowing orthogonally to one another and intersecting at the jet axis.
Figure 7B:
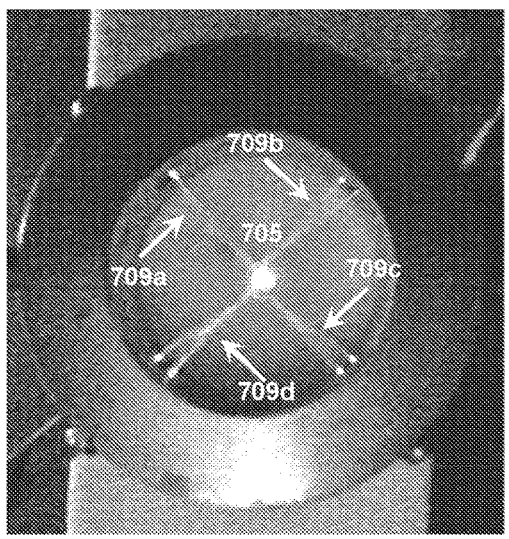
Figure 7C:
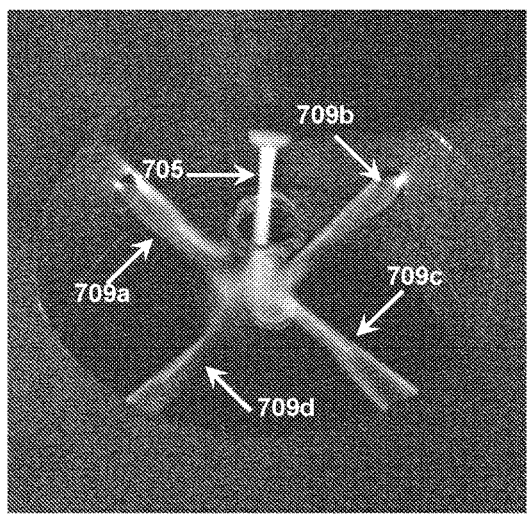

FIGS. 7A-7C illustrates aspects of a different geometry that can be used to produce an enhanced plasma jet volume in accordance with the present invention. In the embodiment illustrated in FIGS. 7A-7C, a plasma jet 705 can be subjected to gas flow from four equally spaced gas nozzles, each at a 90° angle from one another, and in a plane orthogonal to the plasma jet axis, to produce four extended plasma volumes 709a/b/c/d. Such a configuration indicates a plurality of gas streams can be interacted with a plasma jet to produce and arbitrarily large plasma volume in a direction extending outward from the plasma jet axis, and thus the ability to treat larger areas.

Figure 8A:
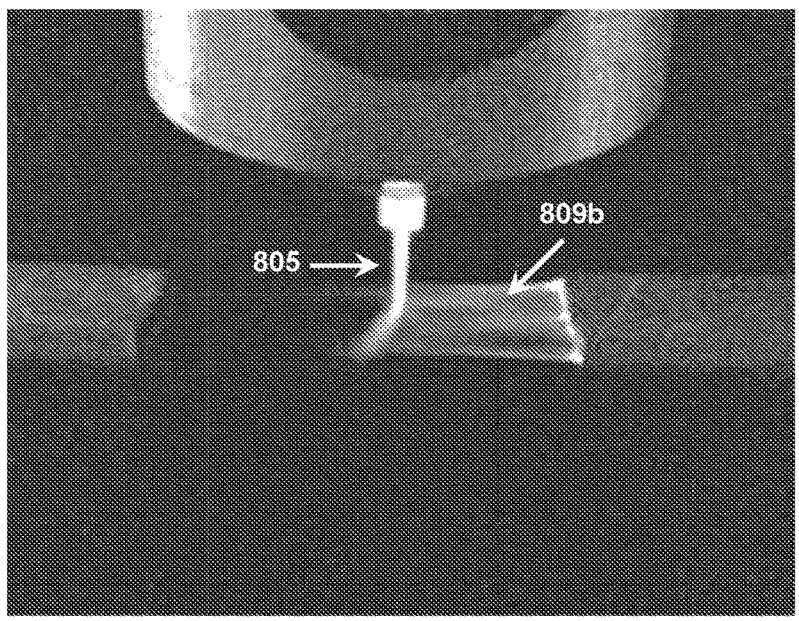
FIGS. 8A and 8B are photographic images illustrating aspects of an extended plasma jet volume produced in accordance with the present invention using flattened gas tubes to shape and direct the neutral gas streams into the plasma jet.
Figure 8B:
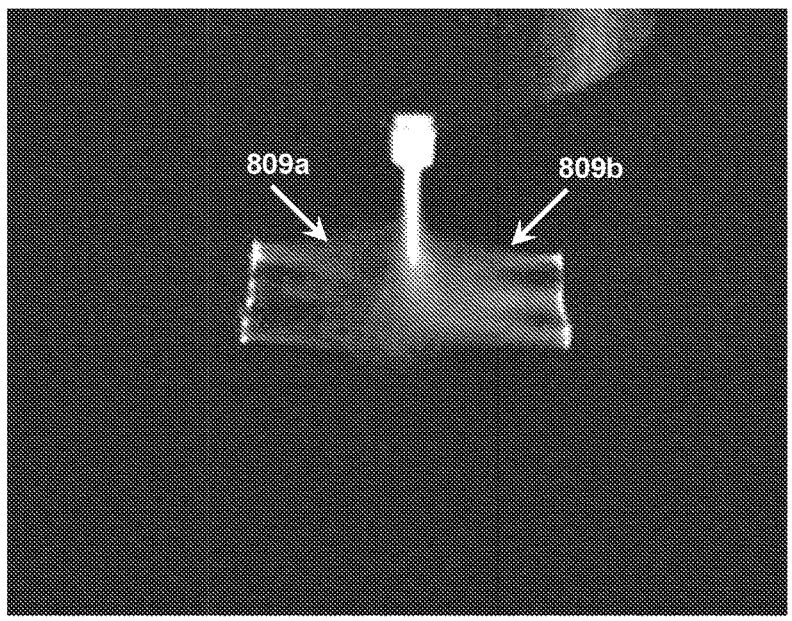

FIGS. 8A and 8B illustrate aspects of still another embodiment of an extended plasma jet volume produced in accordance with the present invention, which can enhance the ability of a single plasma jet to treat larger surface areas. In the embodiment illustrated in FIGS. 8A and 8B, a plasma jet 805 can operate in the presence of one (FIG. 8A) or two (FIG. 8B) sheet-like gas flows produced, e.g., by gas nozzles having a flattened shape. As can be seen from the FIGURES, using this configuration of gas nozzles, the additional plasma volumes 809a/809b produced also have a sheet-like shape. It is expected that exerting fine control over gas flow would provide a large number of possible geometries with highly uniform plasma expansion. Such plasma configurations can be used to treat larger surface areas in each pass, reducing the time and energy needed to treat a large area.

Additionally, sheet-like plasmas have the added benefit of possessing a larger surface area-to-volume ratio than cylindrical plasmas of the same volume.

Figure 9A:
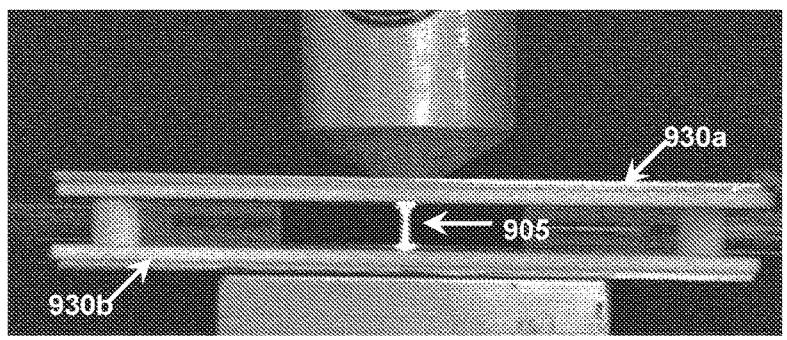
FIGS. 9A-9C are photographic images illustrating aspects of an extended plasma jet volume produced in accordance with the present invention using neutral gas streams situated between two parallel plates.
Figure 9B:
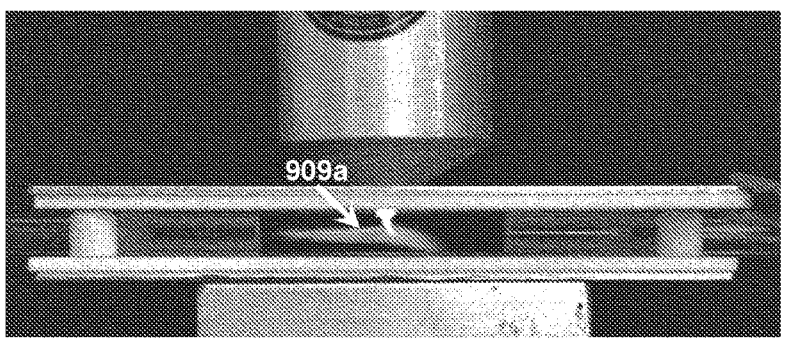
Figure 9C:
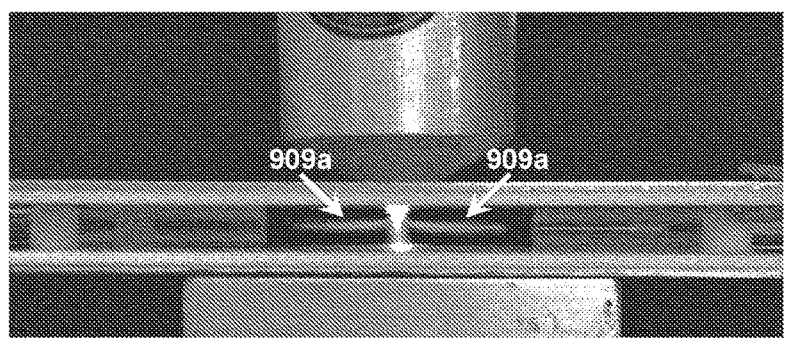

In other cases, it may be desirable to use a plasma to treat a surface within a confined space. FIGS. 9A-9C illustrate that the apparatus and method in accordance with the present invention can be used to produce a spatially extended plasma volume for use in such a confined space. Thus, as illustrated in FIG. 9A, a plasma jet that extends between top and bottom plates 930a/930b can be redirected to form an additional plasma volume 909a (FIG. 9B) or 909a/909b (FIG. 9C) by means of one or two neutral gas flows directed between the plates. The symmetry created by identical top and bottom plates largely eliminates most non-uniformities in gas flow, leading to uniform plasma generation compared to configurations using a single plate or surface. Such a geometry could be used to create a plasma "line source" for the treatment of static surfaces or with moving surfaces such as those used in roll-to-roll polymer web treatments, where the surface area to be treated becomes the bottom plate.

Advantages and New Features

As noted earlier, methods aimed at increasing the volume of plasma jets typically involve simply increasing the number of jets or powered electrodes. While these approaches are straightforward and effective, it comes at significant increase in power and/or driving circuit complexity. The approach described here requires no additional circuitry and the power increase relative to the volume increase is surprisingly low. In addition, the volume expansion can be made orthogonal to the plasma jet axis, thereby increasing the potential treatment area in a manner not possible with parallel plasma jet arrays. Moreover, the use of additional external gas flow with different gas composition is possible. For example, diluting the neutral gas with a molecular and/or reactive gas of choice to target specific materials processing applications.

Although particular embodiments, aspects, and features have been described and illustrated, one skilled in the art would readily appreciate that the invention described herein is not limited to only those embodiments, aspects, and features.

For example, although not described in detail in the present disclosure, one skilled in the art would readily appreciate that in other embodiments using an apparatus and method for producing an extended plasma volume in accordance with the present invention, controlling one or more parameters of the neutral gas flow can also be used to tailor the plasma volume to suit a particular application, geometry, or environment.

All such modifications and additional embodiments are deemed to be within the scope and spirit of the present disclosure and the invention described and claimed herein.

What is claimed is:

1. An apparatus for augmenting a volume of a plasma jet, comprising:
    a plasma jet source configured to produce a plasma jet propagating in a first direction; and
    at least one gas nozzle configured to produce a corresponding neutral gas stream extending towards the plasma jet propagating in a second direction different from the first direction of the plasma jet;
    wherein the neutral gas stream intersects the plasma jet at an arbitrary angle and interacts with the plasma jet;
    wherein when the neutral gas stream interacts with the plasma jet, an extended volume of plasma from the plasma jet extends into the neutral gas stream, the extended volume of plasma flowing in a direction of increasing gas density within the neutral gas stream; and
    wherein a geometry of the gas nozzle, an identity of the neutral gas, a speed of the neutral gas, or a volume of the neutral gas is configured to produce a predetermined augmented volume of plasma having at least one predetermined spatial characteristic.

2. The apparatus for augmenting a volume of a plasma jet according to claim 1, wherein the neutral gas stream extends in a direction orthogonal to a direction of the plasma jet.

3. The apparatus for augmenting a volume of a plasma jet according to claim 1, comprising two gas nozzles configured to produce two neutral gas streams extending towards the plasma jet opposite from one another,
    wherein a common axis of both neutral gas streams intersects the plasma jet at an arbitrary angle; and
    wherein when the neutral gas streams interact with the plasma jet, an extended volume of plasma from the plasma jet extends into each neutral gas stream, the extended volume of plasma flowing in a direction of increasing gas density within each neutral gas stream.

4. The apparatus for augmenting a volume of a plasma jet according to claim 3, wherein both neutral gas streams flow in a direction orthogonal to the direction of the plasma flow from the plasma jet.

5. The apparatus for augmenting a volume of a plasma jet according to claim 1, comprising a plurality of neutral gas nozzles, the gas nozzles being configured to produce a corresponding plurality of neutral gas streams extending towards the plasma jet, each of the neutral gas streams intersecting the plasma jet at an arbitrary angle.

6. The apparatus for augmenting a volume of a plasma jet according to claim 1, comprising a plurality of neutral gas nozzles, the gas nozzles being configured to produce a corresponding plurality of neutral gas streams extending towards the plasma jet, each of the neutral gas streams being orthogonal to the plasma jet.

7. The apparatus for augmenting a volume of a plasma jet according to claim 1;
    wherein the gas nozzle has a flattened shape; and
    wherein extended volume of plasma is in the form of a sheet of plasma flowing in a direction of increasing gas density within each neutral gas stream.

8. The apparatus for augmenting a volume of a plasma jet according to claim 1, wherein the neutral gas comprises a noble gas.

9. The apparatus for augmenting a volume of a plasma jet according to claim 1, wherein the neutral gas comprises helium.

10. The apparatus for augmenting a volume of a plasma jet according to claim 1, wherein the neutral gas comprises neon.

11. The apparatus for augmenting a volume of a plasma jet according to claim 1, wherein the neutral gas comprises a mixture of gases.

12. A method for producing an augmented plasma volume from a plasma jet, comprising:
    providing a plasma jet from a plasma jet source; and
    directing at least one neutral gas stream into the plasma jet;
    wherein each neutral gas stream intersects the plasma jet at an arbitrary angle and interacts with the plasma jet;
    wherein when the neutral gas stream interacts with the plasma jet, an extended volume of plasma from the plasma jet extends into the neutral gas stream, the extended volume of plasma flowing in a direction of increasing gas density within the neutral gas stream; and wherein a geometry of the gas nozzle, an identity of the neutral gas, a speed of the neutral gas, or a volume of the neutral gas is configured to produce a predetermined extended volume of plasma having at least one predetermined spatial characteristic.

13. The method for producing an augmented plasma volume according to claim 12, wherein the at least one neutral gas stream intersects the plasma jet at an arbitrary angle.

14. The method for producing an augmented plasma volume according to claim 12, wherein the at least one neutral gas stream extends in a direction orthogonal to a direction of the plasma jet.

15. The method for producing an augmented plasma volume according to claim 12,
wherein the at least one neutral gas stream is produced from gas nozzles having a flattened shape; and wherein extended volume of plasma is in the form of a sheet of plasma flowing in a direction of increasing gas density within each neutral gas stream.

16. The method for producing an augmented plasma volume according to claim 12, wherein the neutral gas comprises a noble gas.

17. The method for producing an augmented plasma volume according to claim 12, wherein the neutral gas comprises helium.

18. The method for producing an augmented plasma volume according to claim 12, wherein the neutral gas comprises neon.

19. The method for producing an augmented plasma volume according to claim 12, wherein the neutral gas comprises a mixture of gases.

* * * * *